(12) United States Patent
Lin et al.

(10) Patent No.: US 11,733,792 B2
(45) Date of Patent: Aug. 22, 2023

(54) TOUCH DISPLAY DEVICE

(71) Applicant: Novatek Microelectronics Corp., Hsinchu (TW)

(72) Inventors: Yi-Ying Lin, Hualien County (TW); Chih-Chang Lai, Taichung (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 17/165,902

(22) Filed: Feb. 2, 2021

(65) Prior Publication Data

US 2022/0043525 A1 Feb. 10, 2022

Related U.S. Application Data

(60) Provisional application No. 63/062,452, filed on Aug. 7, 2020.

(51) Int. Cl.
| | | |
|---|---|---|
| *G09G 5/00* | (2006.01) | |
| *G06F 3/041* | (2006.01) | |
| *G06F 3/044* | (2006.01) | |
| *G06V 40/13* | (2022.01) | |
| *H10K 59/40* | (2023.01) | |
| *H10K 59/65* | (2023.01) | |
| *H10K 59/121* | (2023.01) | |

(52) U.S. Cl.
CPC .......... *G06F 3/0412* (2013.01); *G06F 3/0445* (2019.05); *G06V 40/1306* (2022.01); *H10K 59/121* (2023.02); *H10K 59/40* (2023.02); *H10K 59/65* (2023.02); *G06F 2203/04111* (2013.01)

(58) Field of Classification Search
CPC ................. G06F 3/0412; G06F 3/0445; G06F 2203/04111; G06K 9/0002; H01L 27/323; H01L 27/3234; H01L 27/326; G06V 40/1306; H10K 59/40; H10K 59/65; H10K 59/121
USPC ........................................................ 345/173
See application file for complete search history.

(56) References Cited

U.S. PATENT DOCUMENTS

| | | | |
|---|---|---|---|
| 10,599,939 B2 | 3/2020 | Gu et al. | |
| 2019/0147213 A1* | 5/2019 | Yeke Yazdandoost | ...................... G06V 40/40 382/124 |
| 2020/0004381 A1* | 1/2020 | Han ..................... | H01L 27/3272 |
| 2021/0200366 A1* | 7/2021 | Bok ..................... | H01L 31/1055 |
| 2021/0232841 A1* | 7/2021 | Wang ................... | G06K 9/0004 |
| 2021/0249495 A1* | 8/2021 | Lee ........................ | H01L 25/18 |
| 2021/0280569 A1* | 9/2021 | You ......................... | H01L 25/50 |

FOREIGN PATENT DOCUMENTS

| | | | | |
|---|---|---|---|---|
| CN | 111353383 | * | 6/2020 | ......... G06V 40/1324 |
| TW | 202127307 | | 7/2021 | |

OTHER PUBLICATIONS

"Office Action of Taiwan Counterpart Application", dated Mar. 3, 2022, p. 1-p. 8.

* cited by examiner

*Primary Examiner* — Jennifer T Nguyen
(74) *Attorney, Agent, or Firm* — JCIPRNET (57) ABSTRACT

A touch display device includes a plurality of photo sensors, a plurality of display pixels, and a touch sensing layer. The touch sensing layer disposed over the plurality of photo sensors and including a plurality of collimating openings corresponding to the plurality of photo sensors respectively to collimate light from different locations to the plurality of optical sensors.

18 Claims, 10 Drawing Sheets

TOUCH DISPLAY DEVICE

CROSS-REFERENCE TO RELATED APPLICATION

This application claims the priority benefit of U.S. provisional application Ser. No. 63/062,452, filed on Aug. 7, 2020. The entirety of the above-mentioned patent application is hereby incorporated by reference herein and made a part of this specification.

BACKGROUND

Technical Field

The present disclosure generally relates to a touch display device. More particularly, the present disclosure relates to a touch display device with photo sensors.

Description of Related Art

A touchscreen is an input device normally layered on the top of an electronic visual display of an information processing system. A user can interact with the information processing system by touching the screen. The user can use the touchscreen to react to what is displayed and to control how text or graphics are displayed; for example, zooming to increase the text size. The touchscreen may facilitate the user to interact directly with what is displayed. Touchscreens are common in electronic devices such as game consoles, personal computers, tablet computers, electronic voting machines, smartphones, and digital appliances. The popularity of smartphones, tablets, and many types of information appliances is driving the demand and acceptance of common touchscreens for portable and functional electronics.

Electronic devices including portable or mobile computing devices, such as laptops, tablets, smartphones, and gaming systems can employ user authentication mechanisms to protect personal data and prevent unauthorized access. User authentication on an electronic device can be carried out through one or multiple forms of biometric identifiers, which can be used alone or in addition to conventional password authentication methods. A popular form of biometric identifiers is a person's fingerprint pattern. A fingerprint sensor can be built into the electronic device to read a user's fingerprint pattern so that the device can only be unlocked by an authorized user of the device through authentication of the authorized user's fingerprint pattern.

SUMMARY

Accordingly, the present disclosure is directed to a touch display device with photo sensors, which is capable of collimating lights to the optical sensor to improve sensing output.

The present disclosure provides a touch display device including a plurality of photo sensors, a plurality of display pixel units, and a touch sensing layer. The touch sensing layer is disposed over the plurality of photo sensors and the display pixel units, wherein the touch sensing layer comprises a plurality of touch sensors and a plurality of first collimating openings positioned between the touch sensors and corresponding to the plurality of photo sensors respectively to collimate light from different locations to the plurality of photo sensors.

According to an embodiment of the present disclosure, the touch display device further includes a cover plate disposed over the touch sensing layer as an interface for being touched by a user.

According to an embodiment of the present disclosure, the touch display device further includes a plurality of fingerprint devices coupled with the plurality of photo sensors, wherein the fingerprint device senses output of the plurality of photo sensors for controlling sensing operation of the photo sensors to generate fingerprint sensing signals.

According to an embodiment of the present disclosure, the fingerprint devices includes a plurality of transistors.

According to an embodiment of the present disclosure, the touch sensing layer further comprises a plurality of pixel openings corresponding to the plurality of pixel units respectively.

According to an embodiment of the present disclosure, wherein the plurality of photo sensors and the plurality of pixel units are in a same layer.

According to an embodiment of the present disclosure, the plurality of photo sensors are interspersed among the plurality of pixel units.

According to an embodiment of the present disclosure, one of the plurality of photo sensors is disposed adjacent to one of the pixel units along a longitudinal direction perpendicular to a transversal direction along which sub-pixels of the pixel units are extended.

According to an embodiment of the present disclosure, one of the plurality of photo sensors is disposed between adjacent two of pixel units along a transversal direction along which sub-pixels of the pixel units are extended.

According to an embodiment of the present disclosure, wherein the plurality of photo sensors and the plurality of pixel units are in different layers.

According to an embodiment of the present disclosure, wherein the plurality of photo sensors are disposed under the plurality of pixel units.

According to an embodiment of the present disclosure, wherein the pixel units are disposed in a patterned metal layer further comprising a plurality of second collimating openings positioned between the pixels units and corresponding to the plurality of photo sensors respectively to collimate light from different locations to the plurality of photo sensors.

According to an embodiment of the present disclosure, the display structure further comprises a display substrate, and the plurality of photo sensors are disposed underneath the display substrate.

According to an embodiment of the present disclosure, the touch sensing layer comprises a single layer of self-capacitance electrodes.

According to an embodiment of the present disclosure, the self-capacitance electrodes are divided into a plurality of touch sensing pads isolated from one another.

According to an embodiment of the present disclosure, the touch sensing layer comprises dual-layers of self-capacitance electrodes.

According to an embodiment of the present disclosure, the touch display device further comprises a touch trace layer, an insulating layer disposed between the touch sensing layer and the touch trace layer and a plurality of conductive vias connected between the touch sensing layer and the touch trace layer.

According to an embodiment of the present disclosure, the touch sensing layer comprises dual-layers of mutual capacitance electrodes.

According to an embodiment of the present disclosure, the touch sensing layer comprises a first set of touch electrodes configured to operate as drive lines and a second set of touch electrodes configured to operate as sense lines.

According to an embodiment of the present disclosure, the touch display device further comprising a bridge layer bridging over adjacent two of the first set of touch electrodes from a top view, an isolation layer disposed between the touch sensing layer and the bridge layer, and a plurality of conductive vias connected between the bridge layer and the adjacent two of the first set of touch electrodes.

According to an embodiment of the present disclosure, the display panel is an organic light emitting diode (OLED) display panel.

According to an embodiment of the present disclosure, the touch display device further includes a cathode layer disposed over the plurality of pixel units.

In light of the foregoing, by forming collimating openings on the touch sensing layer of the touch display panel, the collimating openings are used as a lensless optical design for collimating the returned light from different locations to the photo sensors. Therefore, photo sensors of the touch display device can capture the fingerprint image with a desired spatial resolution for reliable optical fingerprints sensing without additionally configuring any optical collimator over the photo sensors.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Reference will now be made in detail to the present preferred embodiments of the disclosure, examples of which are illustrated in the accompanying drawings. Wherever possible, the same reference numbers are used in the drawings and the description to refer to the same or like parts.

Reference will now be made in detail to the present preferred embodiments of the disclosure, examples of which are illustrated in the accompanying drawings. Wherever possible, the same reference numbers are used in the drawings and the description to refer to the same or like parts. The terms used herein such as "on", "above", "below", "front", "back", "left" and "right" are for the purpose of describing directions in the figures only and are not intended to be limiting of the disclosure. Further, in the discussion and claims herein, the term "on" used with respect to two materials, one "on" the other, means at least some contact between the materials, while "over" and "overlie" mean the materials are in proximity, but possibly with one or more additional intervening materials such that physical contact is possible but not required. Neither "on" nor "over" implies any directionality as used herein.

Unless limited otherwise, the terms "disposed", "connected", "coupled", "mounted" and variations thereof herein are used broadly and encompass direct and indirect connections, couplings, and mountings. Similarly, the terms "facing", "faces" and variations thereof herein are used broadly and encompass direct and indirect facing, and "adjacent to" and variations thereof herein are used broadly and encompass directly and indirectly "adjacent to". Accordingly, the drawings and descriptions will be regarded as illustrative in nature and not as restrictive.

Figure 1:
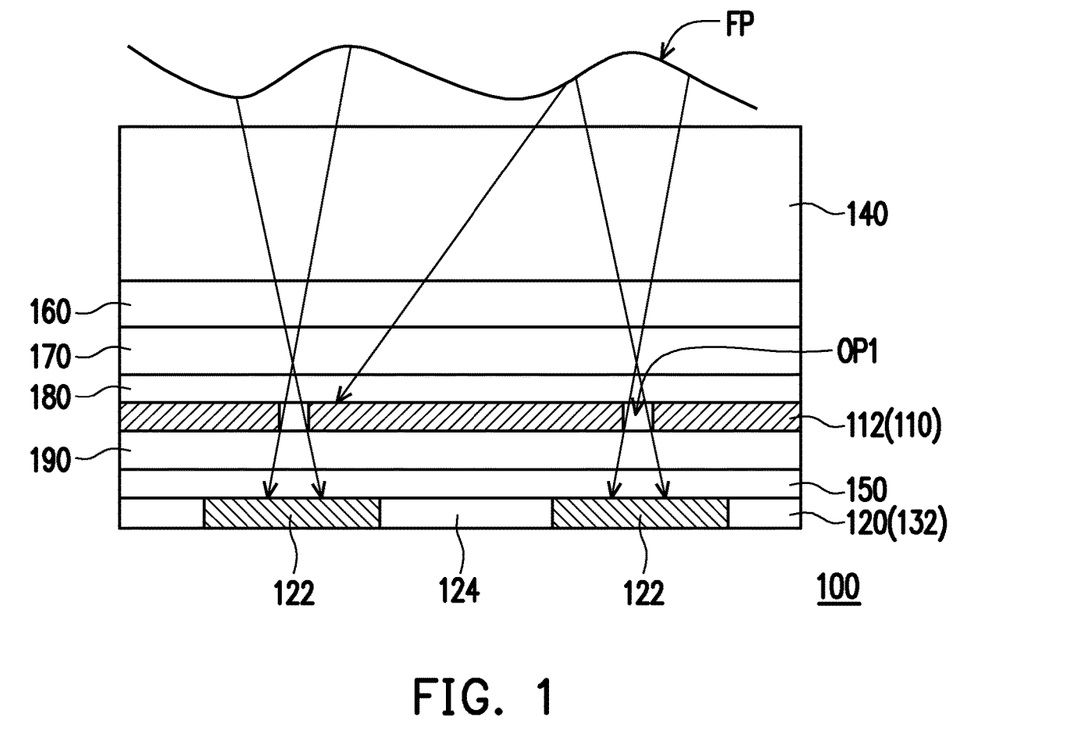
FIG. 1 is a schematic cross sectional view of a touch display device according to some exemplary embodiments in the present disclosure.
Figure 2:
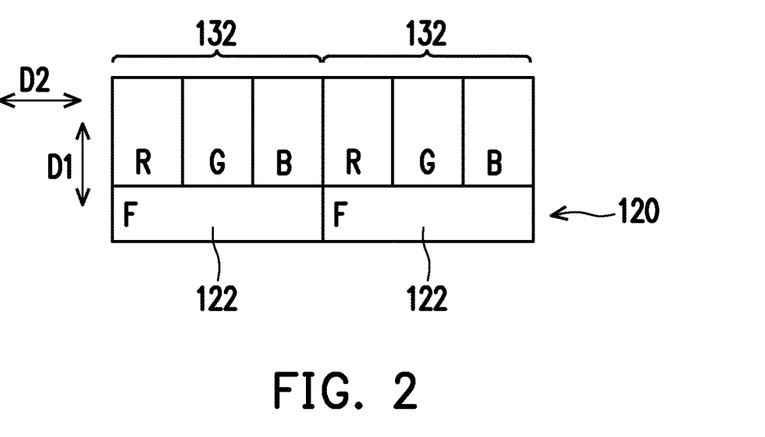
FIG. 2 is a schematic top view of photo sensors interspersed among display units of the touch display device in FIG. 1 according to some exemplary embodiments in the present disclosure.
Figure 3:
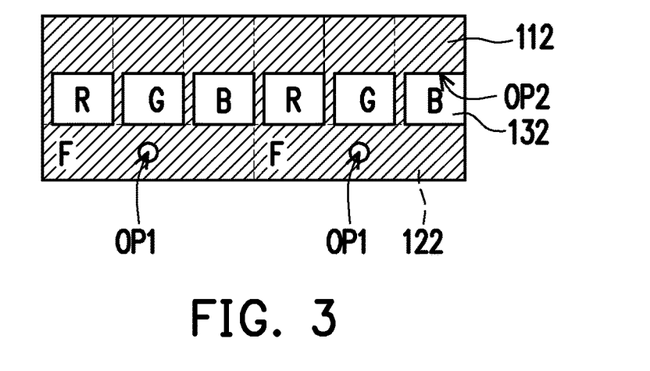
FIG. 3 is a schematic top view of a touch sensing layer over photo sensors and display units of the touch display device in FIG. 1 according to some exemplary embodiments in the present disclosure.

FIG. 1 is a schematic cross sectional view of a touch display device according to some exemplary embodiments in the present disclosure. FIG. 2 is a schematic top view of photo (optical) sensors interspersed among display units of the touch display device in FIG. 1 according to some exemplary embodiments in the present disclosure. FIG. 3 is a schematic top view of a touch sensing layer over photo sensors and display units of the touch display device in FIG. 1 according to some exemplary embodiments in the present disclosure. Referring to FIG. 1 to FIG. 3, in some exemplary embodiments, a touch display device 100 includes a plurality of photo sensors 122, a plurality of display pixel units 132, and a touch sensing layer 110. In some embodiments, the touch display device 100 is an output device for presentation of information in visual form (e.g., light-emitting diode (LED) display, organic light emitting diode (OLED) displays, electronic paper display, interferometric modulator display, electro-wetting display, or the like). In the present embodiment, the touch display device 100 is an OLED device, but the disclosure is not limited thereto. The touch sensing layer 110, which is disposed over the photo sensors 122 and the display pixel units 132, includes a plurality of touch sensors 112 and a plurality of first collimating openings OP1 that are positioned between the touch sensors 112 and correspond to the plurality of photo sensors 122 respectively. In some embodiments, the first collimating openings OP1 are aligned with the plurality of photo sensors 122 respectively as shown in FIG. 1 and FIG. 3, so as to collimate light from different locations to the optical sensors 122. For example, the collimating openings OP1 are located right above the corresponding photo sensors 122 respectively.

In some exemplary embodiments, the touch display device 100 may include a fingerprint identifying module 120, which includes the plurality of photo sensors 122 and at least one fingerprint device 124 coupled with the photo sensors 122. In some embodiments, the photo sensors 122 may include photodiodes, or the like. In some embodiments, the fingerprint device 124 may include a fingerprint read out circuit, or any other components in the fingerprint identifying module 120 other than photo sensors (photodiodes), such as thin film transistors (TFTs), or the like. The fingerprint device 124 may be configured to sense outputs of the photo sensors 122. In some embodiments, the photo sensors 122 is a sensor circuit that can sense touch of human finger and/or any part of a human or other primate hand. The touch display device 100 may further include a (transparent) cover plate 140 disposed over the touch sensor layer 110 as an interface for being touched by a user, and thereby generate the returned light received by the photo sensors 122 for detecting a fingerprint. The first collimating openings OP1 on the touch sensor layer 110 are configured to collimate the returned light from different locations to the photo sensors 122. More specifically, the first collimating openings OP1 are configured to narrow or focus reflected light from a user's finger FP toward the photo sensors 122.

In some embodiments, the touch display device 100 is an OLED device, which includes a plurality of pixel units 132, and each of the pixel units 132 is operable to emit light for forming a portion of a display image. The light produced by the display units 132 for displaying images can pass through the cover plate 140 in order to be viewed by a user. A finger FP can touch the top surface of the cover plate 140 and thus interacts with the light at the top surface to cause the reflected or scattered light at the surface area of the touch, which is directed or focused toward the corresponding photo sensors 122 by the first collimating openings OP1 to capture a part of the fingerprint image of the finger FP. Therefore, the first collimating openings OP1 formed on the touch sensing layer 110 are used as a lensless optical design for capturing the fingerprint image with a desired spatial resolution for reliable optical fingerprints sensing.

Referring to FIG. 2 and FIG. 3, in some exemplary embodiments, the photo sensors 122 and the pixel units 132 are in a same layer, wherein the photo sensors 122 are interspersed among the pixel units 132. Namely, the fingerprint identifying module 120 is an in display fingerprint reader. For example, in the present embodiment, one of the photo sensors 122 is disposed adjacent to (any) one of pixel units 132 along a longitudinal direction D1, which is perpendicular to a transversal direction D2 along which sub-pixels (R, G, B) of the pixel units 132 are extended, but the disclosure is not limited thereto. A part from the first collimating openings OP1, the touch sensing layer 110 may further include a plurality of pixel openings OP2 corresponding to the plurality of pixel units 132 (sub-pixels) respectively. It is noted that configuration of the pixel units 132 shown in FIG. 2 and FIG. 3 is just one example of how to realize an RGB pixel, and is arranged in accordance with a traditional stripe configuration. For OLED display panels specifically, other configurations have been proposed, such as the PenTile type configurations. In such a configuration, two red, two green, and one blue sub-pixel are included in one pixel. In other embodiments, the display panel 130 may adopt a RGBW pixel layout, where each pixel may be divided into four sub-pixels. A white OLED may be used for all four sub-pixels. These and other potential specific pixel configurations will not be discussed herein in any further detail, and it should be noted that the present disclosure is applicable regardless of the exact layout of the pixel configuration.

In some embodiments, the touch display device 100 may further include an adhesive 160 disposed below the cover plate 140. The adhesive may be, for example, optically clear adhesive (OCA), or the like. In alternative embodiments, other adhesive which do not interfere with operation of the other elements of the touch display device 100 could be used. In one embodiment, the touch display device 100 can include a polarizer layer 170 disposed below the adhesive 160. The polarizer layer 170 is configured to block external light reflection inside the panel. In one embodiment, the touch display device 100 may include an isolation layer 180 disposed below the polarizer layer 170.

In some embodiments, the touch display device 100 may include a thin film encapsulation (TFE) structure, which is based on a multi-layer film, made of alternating organic and inorganic layers. The inorganic layers are typically made of metal oxides and act as barriers for moisture. In TFE structures, organic planarization interlayers are employed, in order to improve the mechanical properties of the multilayer (flexibility without delamination) and to limit, to some extent the water permeation through the pinholes. In some embodiments, the touch display device 100 may include a cathode layer 150 disposed over the light emitting structure, e.g., the pixel units 132. In some exemplary embodiments, since the OLED touch display device 100 may be a top emission device, the cathode layer 150 may include a transparent material. For example, the transparent material may include gold (Au), Aluminum (Al), silver (Ag), magnesium-silver alloy (MgAg), silver-magnesium alloy (AgMg), or the like.

With such configuration, by forming first collimating openings OP1 on the touch sensing layer 110, the first collimating openings OP1 are used as a lensless optical design for collimating the returned light from different locations to the photo sensors 122. Therefore, photo sensors 122 of the touch display device 100 can capture the fingerprint image with a desired spatial resolution for reliable optical fingerprints sensing without additionally configuring any optical collimator over the photo sensors 122.

Figure 4:
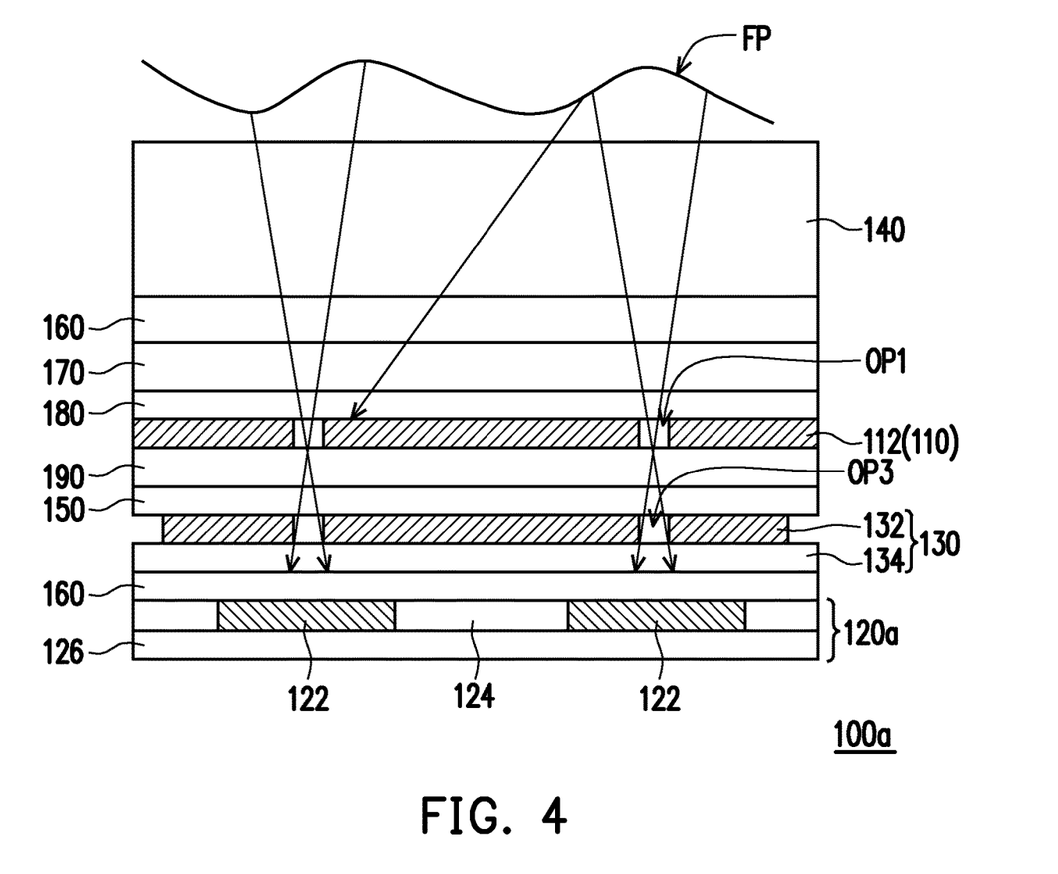
FIG. 4 is a schematic cross sectional view of a touch display device according to some exemplary embodiments in the present disclosure.

FIG. 4 is a schematic cross sectional view of a touch display device according to some exemplary embodiments in the present disclosure. It is noted that the touch display device 100a shown in FIG. 4 contains many features same as or similar to the touch display devices disclosed in the earlier embodiments. For purpose of clarity and simplicity, detail description of same or similar features may be omitted, and the same or similar reference numbers denote the same or like components. The main differences between the touch display device 100a shown in FIG. 4 and the touch display devices disclosed in the earlier embodiments are described as follows.

With now reference to FIG. 4, in some embodiments, a display structure 130, which includes the pixel units 132, is placed over the fingerprint identifying module 120a. To be more specific, the display structure 130 is disposed between the touch sensing layer 110 and the plurality of photo sensors 122. That is, the photo sensors 122 and the pixel units 132 are in different layers, and the photo sensors 122 are disposed under the pixel units 132. In the present embodiment, the display structure 130 includes a patterned metal layer, which includes the pixel units 132 and a plurality of second collimating openings OP3, which is positioned between the pixels units 132 and correspond to the photo sensors 122 respectively. In some embodiments, the second collimating openings OP3 are aligned with the photo sensors 122 and the first collimating openings OP1 respectively. To be more specific, in one of the embodiments, an axis of one of the second collimating openings OP3 is aligned (e.g., collinear) with an axis of respectively one of the first collimating openings OP1, but the disclosure is not limited thereto. In some embodiments, the sizes (diameters) of the first collimating openings OP1 may be different from those of the second collimating openings OP3. For example, the sizes (diameters) of the first collimating openings OP1 may be greater than those of the second collimating openings OP3, but the disclosure is not limited thereto. The layout of the touch sensing layer 110 may be the same or similar to the touch sensing layer 110 shown in FIG. 3, which includes the first collimating openings OP1 and pixel openings OP2 for aligning with (i.e. partially exposing) the photo sensors 122 and the pixel units 132 respectively. It's just that, in the present embodiment, the pixel units 132 and the photo sensors 122 are at different levels.

In some embodiments, the display structure 130 may further include a display (transparent) substrate 134, and the photo sensors 122 are disposed underneath the display substrate 134. Namely, the fingerprint identifying module 120a is an under display fingerprint reader. In the example of the display structure 130 being an OLED display, the display structure 130 can include the substrate 134, an array of transistors, one or more metallization layers, one or more vias, an OLED stack, color filters, and additional components and circuitry. For example, the substrate 134 can be organic solids, inorganic solids, or a combination of organic and inorganic solids. The substrate 134 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. The substrate can be a homogeneous mixture of materials, a composite of materials, or multiple layers of materials. In some embodiments, the fingerprint identifying module 120a may further include a substrate 126. The material of the substrate 126 may be the same or similar to that of the substrate 134.

Figure 5:
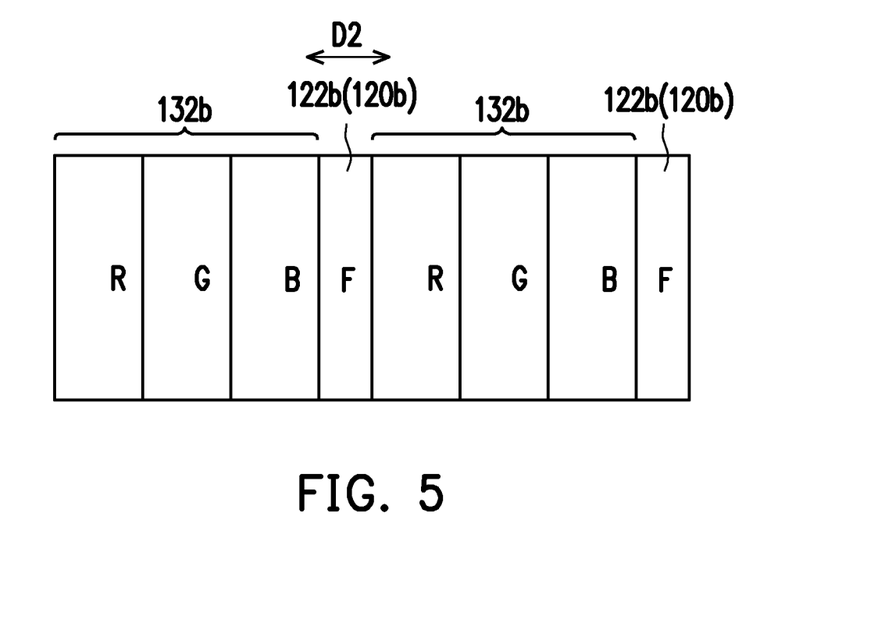
FIG. 5 is a schematic top view of photo sensors interspersed among display units of a touch display device according to some exemplary embodiments in the present disclosure.
Figure 6:
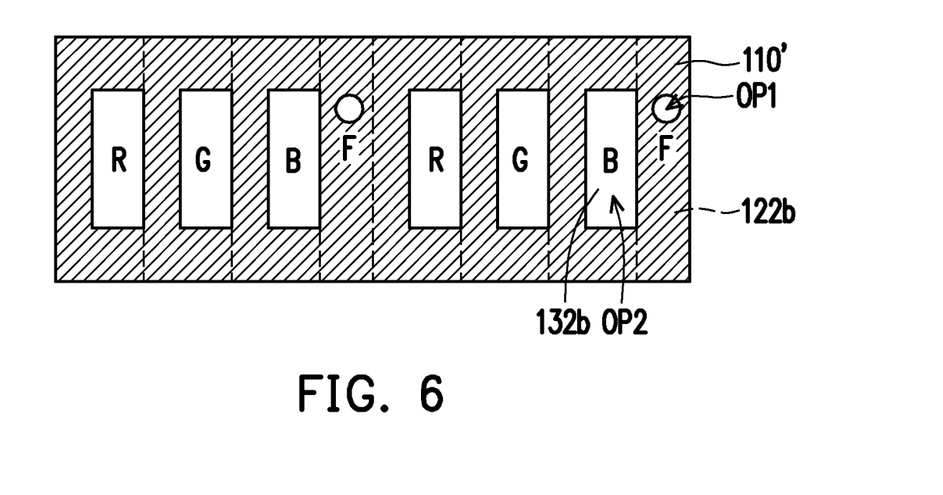
FIG. 6 is a schematic top view of a touch sensing layer over photo sensors and display units of a touch display device according to some exemplary embodiments in the present disclosure.
Figure 7:
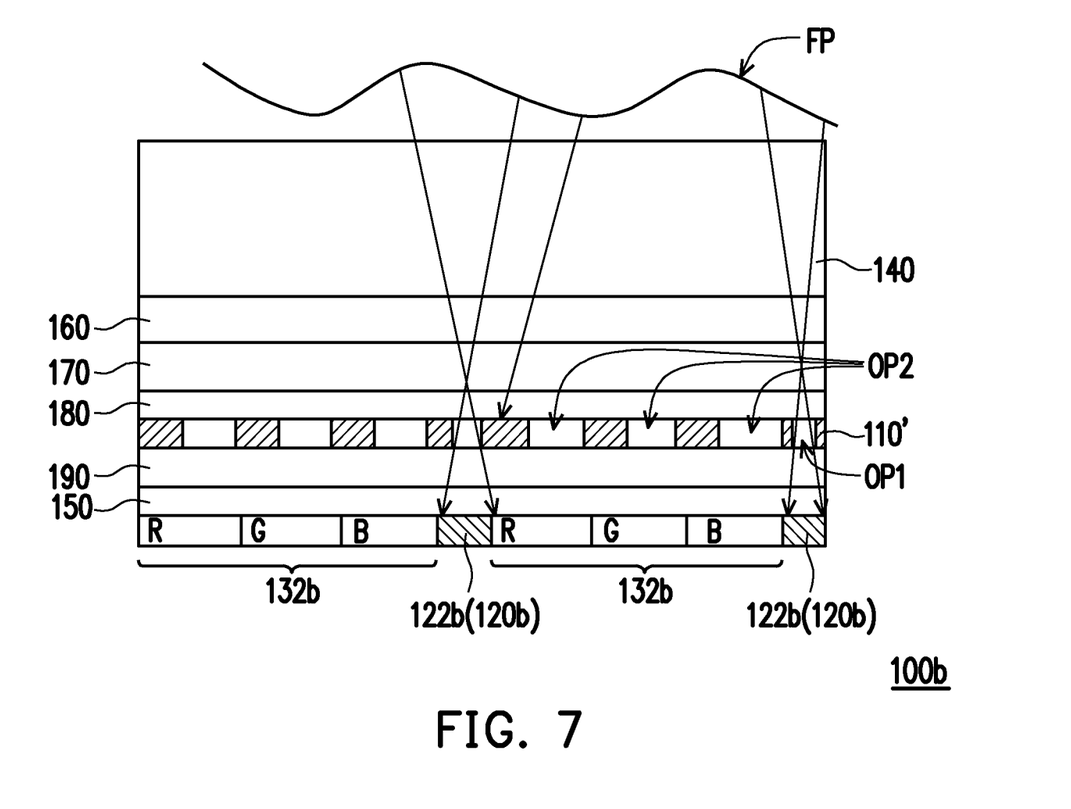
FIG. 7 is a schematic cross sectional view of a touch display device according to some exemplary embodiments in the present disclosure.

FIG. 5 is a schematic top view of photo sensors interspersed among display units of a touch display device according to some exemplary embodiments in the present disclosure. FIG. 6 is a schematic top view of a touch sensing layer over photo sensors and display units of a touch display device according to some exemplary embodiments in the present disclosure. FIG. 7 is a schematic cross sectional view of a touch display device according to some exemplary embodiments in the present disclosure. It is noted that the touch display device 100b shown in FIG. 5 to FIG. 7 contains many features same as or similar to the touch display devices disclosed in the earlier embodiments. For purpose of clarity and simplicity, detail description of same or similar features may be omitted, and the same or similar reference numbers denote the same or like components. The main differences between the touch display device 100b shown in FIG. 5 to FIG. 7 and the touch display devices disclosed in the earlier embodiments are described as follows.

Referring to FIG. 5 to FIG. 7, in some embodiments, the photo sensors 122b are interspersed among the pixel units 132b. Namely, the fingerprint identifying module 120b is an in display fingerprint reader. For example, in the present embodiment, one of the photo sensors 122b is disposed between (any) adjacent two of pixel units 132b along a transversal direction D2, but the disclosure is not limited thereto. In other words, the photo sensors 122b and the pixel units 132b are arranged alternately along the transversal direction D2. Accordingly, in the touch sensing layer 110', the first collimating openings OP1 corresponding to the photo sensors 122b and the pixel openings OP2 corresponding to the pixel units 132 are arranged along the transversal direction D2. It is noted that configuration of the pixel units 132b and the photo sensors 122b shown in FIG. 5 and FIG. 6 is just one example of integrated the pixel units 132b with the photo sensors 122b. Other configurations have been proposed. These and other potential specific configurations will not be discussed herein in any further detail, and it should be noted that the present disclosure is applicable regardless of the exact layout of the pixel and photo sensors configuration.

Figure 8:
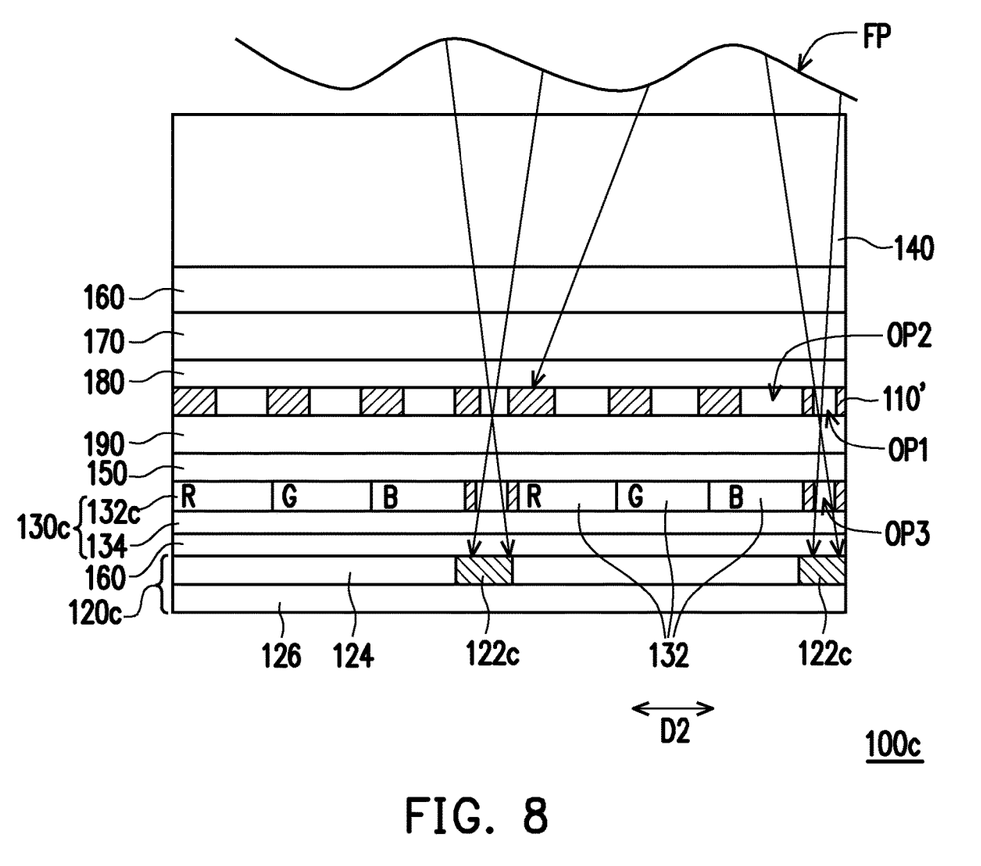
FIG. 8 is a schematic cross sectional view of a touch display device according to some exemplary embodiments in the present disclosure.

FIG. 8 is a schematic cross sectional view of a touch display device according to some exemplary embodiments in the present disclosure. It is noted that the touch display device 100c shown in FIG. 8 contains many features same as or similar to the touch display devices disclosed in the earlier embodiments. For purpose of clarity and simplicity, detail description of same or similar features may be omitted, and the same or similar reference numbers denote the same or like components. The main differences between the touch display device 100c shown in FIG. 8 and the touch display devices disclosed in the earlier embodiments are described as follows.

With now reference to FIG. 8, in some embodiments, the display structure 130 is placed over the fingerprint identifying module 120c. To be more specific, the display structure 130c is disposed between the touch sensing layer 110' and the plurality of photo sensors 122c. In the present embodiment, the display structure 130c includes a patterned metal layer, which includes the pixel units 132c and a plurality of second collimating openings OP3, which is correspond to the photo sensors 122c respectively. In some embodiments, the second collimating openings OP3 are aligned with the photo sensors 122c and the first collimating openings OP1 respectively. To be more specific, in one of the embodiments, an axis of one of the second collimating openings OP3 is aligned (e.g., collinear) with an axis of respectively one of the first collimating openings OP1, but the disclosure is not limited thereto. In some embodiments, the sizes (diameters) of the first collimating openings OP1 may be different from those of the second collimating openings OP3. For example, the sizes (diameters) of the first collimating openings OP1 may be greater than those of the second collimating openings OP3, but the disclosure is not limited thereto. It is noted that the layout of the touch sensing layer 110' in the present embodiment may be the same or similar to the touch sensing layer 110' shown in FIG. 6, which includes the first collimating openings OP1 and pixel openings OP2 for aligning with (i.e. partially exposing) the photo sensors 122c and the pixel units 132c respectively. It's just that, in the present embodiment, the pixel units 132c and the photo sensors 122c are at different levels (layers).

In some embodiments, the display structure 130c may further include a display (transparent) substrate 134, and the photo sensors 122c are disposed underneath the display panel substrate 134. Namely, the fingerprint identifying module 120c is an under display fingerprint reader. In some embodiments, the display structure 130c may be an OLED display, and the display structure 130 can include the substrate 134, an array of transistors, one or more metallization layers, one or more vias, an OLED stack, color filters, and additional components and circuitry. In some embodiments, the fingerprint identifying module 120c may further include a substrate 126. The material of the substrate 126 may be the same or similar to that of the substrate 134.

In the present embodiment, from a top view, one of the photo sensors 122c is between (any) adjacent two of pixel units 132 along a transversal direction (e.g., the transversal direction D2 shown in FIG. 5), but the disclosure is not limited thereto. In other words, the photo sensors 122c and the pixel units 132c are arranged alternately along the transversal direction. Accordingly, in the touch sensing layer 110', the first collimating openings OP1 corresponding to the photo sensors 122c and the pixel openings OP2 corresponding to the pixel units 132 are arranged along the transversal direction D2.

Figure 9:
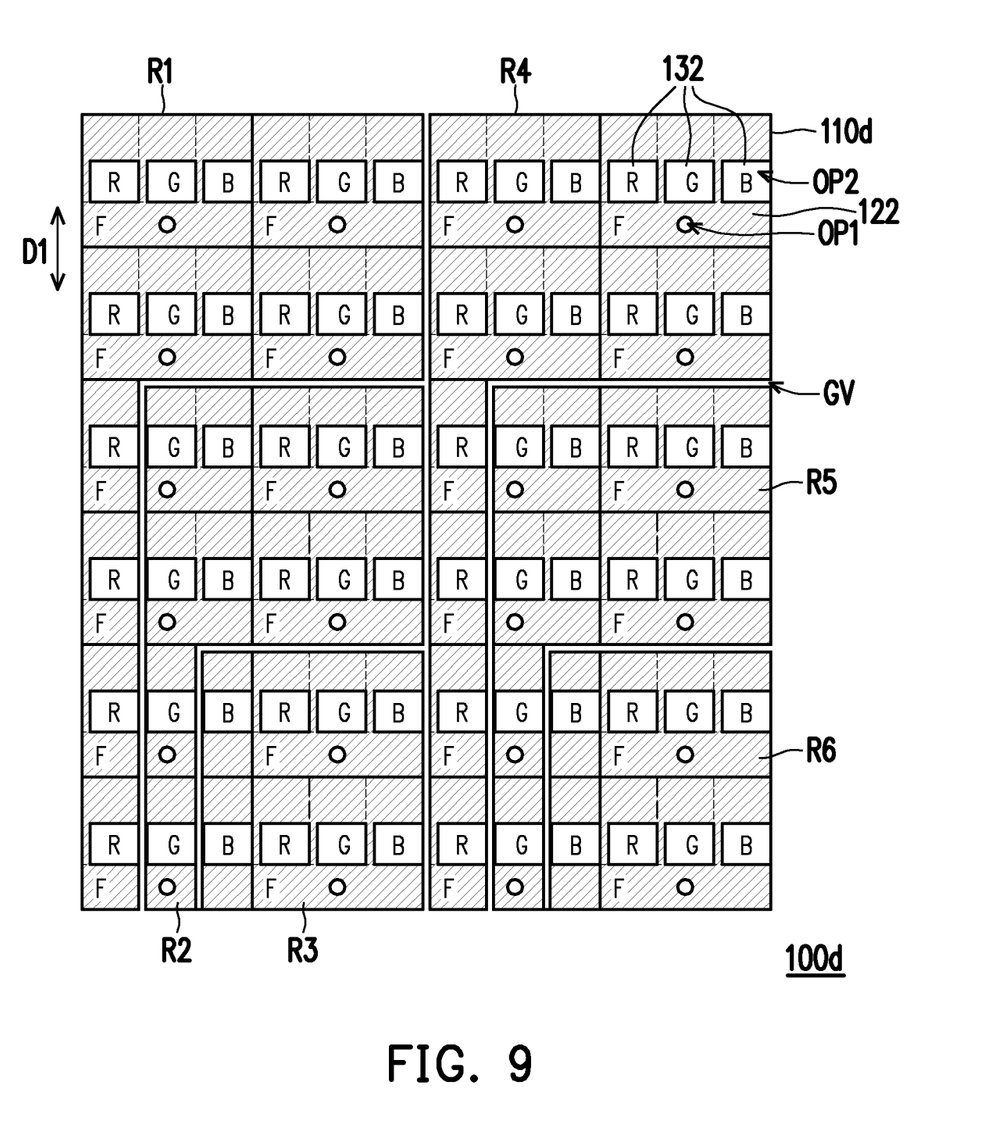
FIG. 9 is a schematic top view of a touch sensing layer over photo sensors and display units of a touch display device according to some exemplary embodiments in the present disclosure.

FIG. 9 is a schematic top view of a touch sensing layer over photo sensors and display units of a touch display device according to some exemplary embodiments in the present disclosure. It is noted that the touch display device 100d shown in FIG. 9 contains many features same as or similar to the touch display devices disclosed in the earlier embodiments. For purpose of clarity and simplicity, detail description of same or similar features may be omitted, and the same or like components. The main differences between the touch display device 100d shown in FIG. 9 and the touch display devices disclosed in the earlier embodiments are described as follows.

Referring to FIG. 9, in the present embodiment, the touch sensing layer 110d includes a single layer of self-capacitance electrodes. That is to say, the touch display device 100d is a self-capacitance touch display device. In the present embodiment, the touch sensing layer 110d may include a grid-like array of traces including electrodes or pads. Each electrode, or pad, is individually addressable. In the present embodiment, the touch sensing layer 112d are divided into a plurality of touch sensing pads R1~R6, which are isolated from one another through a plurality of grooves GV. It is noted that configuration of the touch sensing layer 112d shown in FIG. 9 is just one example of dividing multiple sensing pads with grooves. Other configurations have been proposed. These and other potential specific configurations will not be discussed herein in any further detail, and it should be noted that the present disclosure is applicable regardless of the exact layout of touch sensing layer configuration.

In the present embodiment, the photo sensors 122 are interspersed among the pixel units 132 from a top view. The photo sensors 122 may be at the same level as the pixel units 132, but the disclosure is not limited thereto. In other embodiment, the photo sensors 122 are at a level that is different from the pixel units 132 are. For example, in the present embodiment, one of the photo sensors 122 is disposed adjacent to (any) one of pixel units 132 along a longitudinal direction D1, but the disclosure is not limited thereto. A part from the first collimating openings OP1, the touch sensing layer 110 may further include a plurality of pixel openings OP2 corresponding to the plurality of pixel units 132 respectively. It is noted that configuration of the pixel units 132 shown in FIG. 2 and FIG. 3 is just one example of how to realize an RGB pixel, and is arranged in accordance with a traditional stripe configuration.

Figure 10:
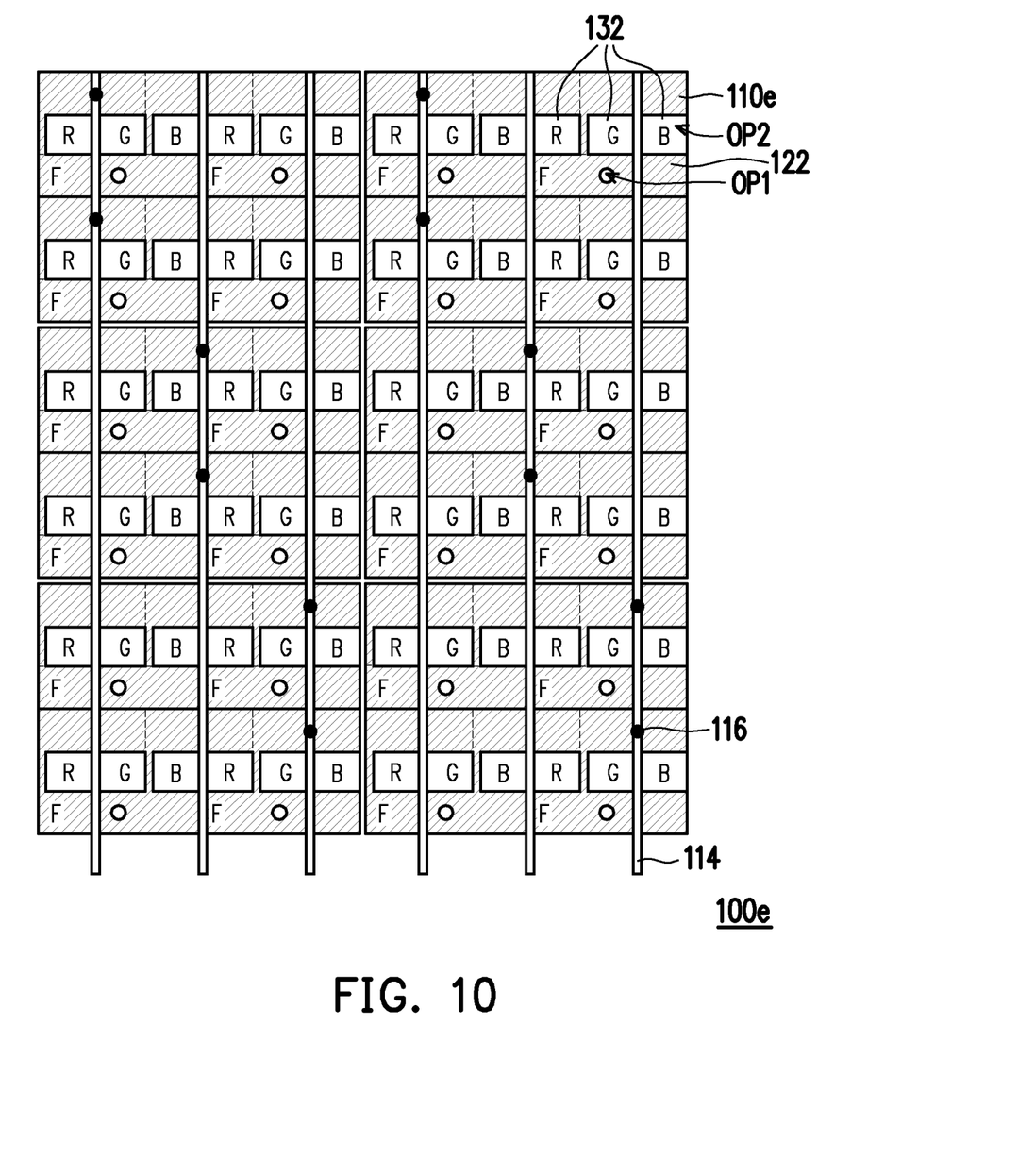
FIG. 10 is a schematic top view of a touch sensing layer over photo sensors and display units of a touch display device according to some exemplary embodiments in the present disclosure.
Figure 11:
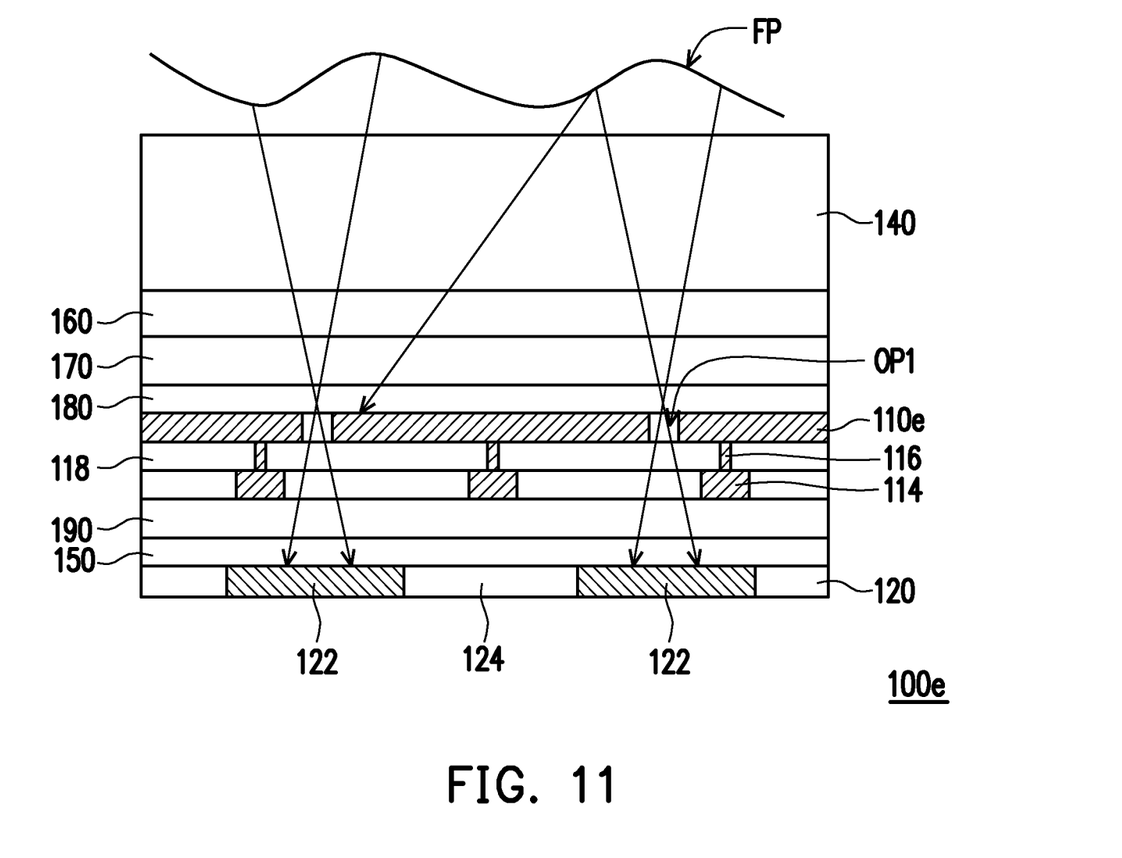
FIG. 11 is a schematic cross sectional view of the touch display device in FIG. 10 according to some exemplary embodiments in the present disclosure.

FIG. 10 is a schematic top view of a touch sensing layer over photo sensors and display units of a touch display device according to some exemplary embodiments in the present disclosure. FIG. 11 is a schematic cross sectional view of the touch display device in FIG. 10 according to some exemplary embodiments in the present disclosure. It is noted that the touch display device 100e shown in FIG. 10 and FIG. 11 contains many features same as or similar to the touch display devices disclosed in the earlier embodiments. For purpose of clarity and simplicity, detail description of same or similar features may be omitted, and the same or similar reference numbers denote the same or like components. The main differences between the touch display device 100e shown in FIG. 10 and FIG. 11 and the touch display devices disclosed in the earlier embodiments are described as follows.

Referring to FIG. 10, in the present embodiment, the touch sensing layer 112e includes a dual-layers of self-capacitance electrodes. In this implementation, the touch structure including the touch sensing layer 110e further includes a touch trace layer 114, an insulating layer 118 and a plurality of conductive vias 116. The touch trace layer 114 includes a plurality of touch traces 114 for connecting the respective touch sensing electrodes in the touch sensing layer 110e. The insulating layer 118 is disposed between the touch sensing layer 110e and the touch trace layer 114. The conductive vias 116 may extend through the insulating layer 118 for electrically connecting the touch sensing layer 112e and the touch trace layer 114. In other words, in the touch structure, the touch trace layer 114 and the touch sensing layer 110e of are arranged on different levels (layers) and are connected through the conductive vias 116. It is noted that configuration of the touch sensing layer 110e and the touch trace layer 114 shown in FIG. 10 is just one of the possible examples. Other configurations have been proposed. These and other potential specific configurations will not be discussed herein in any further detail, and it should be noted that the present disclosure is applicable regardless of the exact layout of touch panel configuration.

Figure 12:
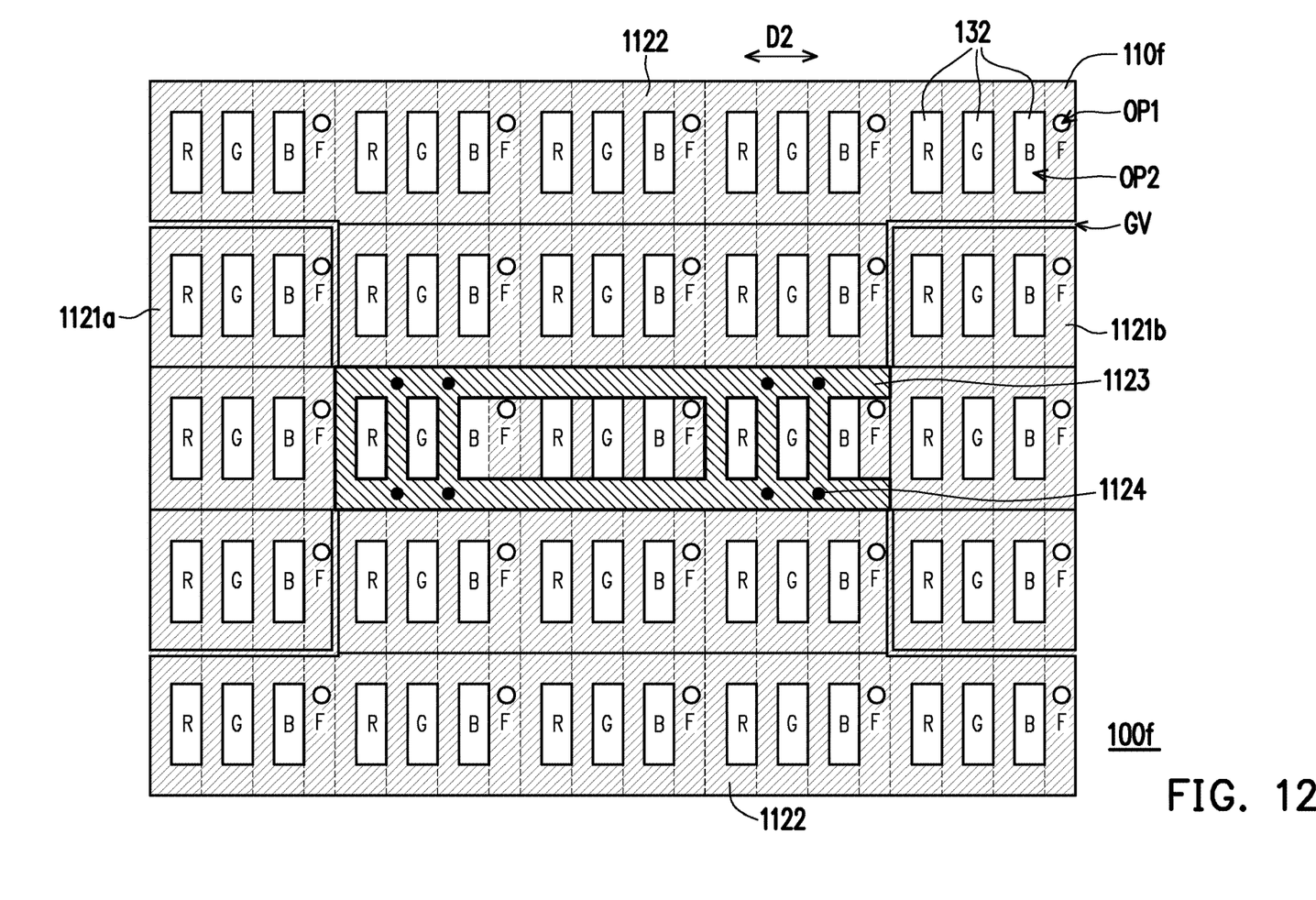
FIG. 12 is a schematic top view of a touch sensing layer over photo sensors and display units of a touch display device according to some exemplary embodiments in the present disclosure.
Figure 13:
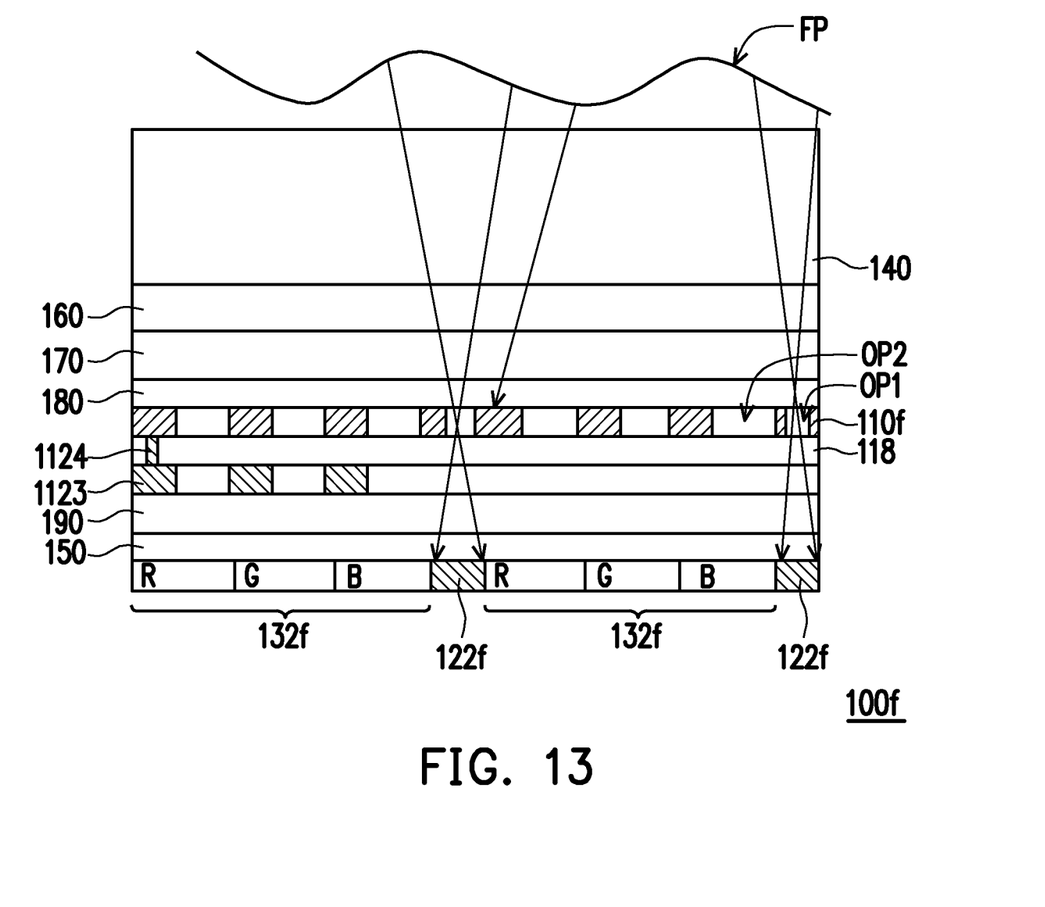
FIG. 13 is a schematic cross sectional view of the touch display device in FIG. 12 according to some exemplary embodiments in the present disclosure.

FIG. 12 is a schematic top view of a touch sensing layer over photo sensors and display units of a touch display device according to some exemplary embodiments in the present disclosure. FIG. 13 is a schematic cross sectional view of the touch display device in FIG. 12 according to some exemplary embodiments in the present disclosure. It is noted that the touch display device 100f shown in FIG. 12 and FIG. 13 contains many features same as or similar to the touch display devices disclosed in the earlier embodiments. For purpose of clarity and simplicity, detail description of same or similar features may be omitted, and the same or similar reference numbers denote the same or like components. The main differences between the touch display device 100f shown in FIG. 12 and FIG. 13 and the touch display devices disclosed in the earlier embodiments are described as follows.

Referring to FIG. 12 and FIG. 13, in the present embodiment, the touch sensing layer 112f includes a dual-layers of mutual capacitance electrodes. That is to say, the touch display device 100f is a mutual capacitance touch display device. In this implementation, mutual capacitance electrodes are designed with a grid-like array of electrodes and traces. The mutual capacitance touch display device works by applying a uniform electrical field over these capacitors. Accordingly, when a finger touches near an intersection, some of the mutual capacitance between the row and column is coupled to the finger which reduces the capacitance at the intersection as measured by the device. This reduced capacitance crosses the touch threshold set by the device indicating a touch has occurred. In general, capacitance changes in mutual capacitance devices can be measured at every point of the grid. One of the key benefits of using mutual capacitance is its support for multi-touch function.

In the present embodiment, for example, the touch sensing layer 110f includes a first set of touch electrodes (sensors) 1121a, 1121b (merely two electrodes are depicted for illustration purpose, but are not limited thereto) configured to operate as drive lines and a second set of touch electrodes 1122 (merely two electrodes connected to one another are depicted for illustration purpose, but are not limited thereto) configured to operate as sense lines. In the present embodiment, the touch panel 110f further includes a bridge layer 1123, an isolation layer 118, and a plurality of conductive vias 1124. The bridge layer 1123 is configured to bridge over (any) adjacent two of the first set of touch electrodes 1121a, 1121b from a top view. The isolation layer 118 is disposed between the touch sensing layer 110f and the bridge layer 1123, and the conductive vias 1124 are connected between the bridge layer 1123 and the adjacent two of the first set of touch electrodes 1121a, 1121b. Namely, the bridge layer 1123 and the touch sensing layer 110f are at two different levels (layers) and connected through the conductive vias 1124. With such configurations, the adjacent two of the first set of touch electrodes 1121a, 1121b are spaced apart from one another and partially overlapped with the bridge layer 1123 from a top view. The conductive vias 1124 are disposed at places where the touch electrodes 1121a, 1121b and the bridge layer 1123 are overlapped from a top view, such that the touch electrodes 1121a, 1121b can be connected to one another though the bridge layer 1123 and the conductive vias 1124 and form the drive lines. It is noted that configuration of the touch sensing layer 110f shown in FIG. 12 is just one of the possible examples. Other configurations have been proposed. These and other potential specific configurations will not be discussed herein in any further detail, and it should be noted that the present disclosure is applicable regardless of the exact layout of touch sensing layer configuration.

In the present embodiment, the photo sensors 122f are interspersed among the pixel units 132f. More specifically, one of the photo sensors 122f is disposed between (any) adjacent two of pixel units 132f along a transversal direction D2, but the disclosure is not limited thereto. In other words, the photo sensors 122b and the pixel units 132 are arranged alternately along the transversal direction D2. Accordingly, in the touch sensing layer 110f, the first collimating openings OP1 corresponding to the photo sensors 122f and the pixel openings OP2 corresponding to the pixel units 132f are arranged along the transversal direction D2. It is noted that configuration of the pixel units 132f and the photo sensors 122f shown in FIG. 12 and FIG. 13 is just one example of integrated the pixel units 132f with the photo sensors 122f. Other configurations have been proposed. These and other potential specific configurations will not be discussed herein in any further detail, and it should be noted that the present disclosure is applicable regardless of the exact layout of the pixel and photo sensors configuration.

Based on the above discussions, it can be seen that the present disclosure offers various advantages. It is understood, however, that not all advantages are necessarily discussed herein, and other embodiments may offer different advantages, and that no particular advantage is required for all embodiments.

In sum, by forming collimating openings on the touch sensing layer of the touch display panel, the collimating openings are used as a lensless optical design for collimating the returned light from different locations to the photo sensors. Therefore, photo sensors of the touch display device can capture the fingerprint image with a desired spatial resolution for reliable optical fingerprints sensing without additionally configuring any optical collimator over the photo sensors.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A touch display device, comprising:
a fingerprint identifying module comprising a plurality of photo sensors and at least one fingerprint device arranged in a side-by-side manner, wherein the at least one fingerprint device is coupled with the photo sensors and for sensing outputs of the plurality of photo sensors;
a plurality of display pixel units; and
a touch sensing layer disposed over the plurality of photo sensors and the display pixel units, wherein the touch sensing layer comprises a plurality of touch sensors and a plurality of first collimating openings with side walls extending through the touch sensing layer, positioned between the touch sensors and corresponding to the plurality of photo sensors respectively to collimate light from different locations to the plurality of photo sensors, wherein the plurality of photo sensors and the plurality of pixel units are in different layers.

2. The touch display device as claimed in claim 1, further comprising a cover plate disposed over the touch panel as an interface for being touched by a user.

3. The touch display device as claimed in claim 1, further comprising at least one fingerprint device coupled with the plurality of photo sensors for controlling sensing operation of the photo sensors to generate fingerprint sensing signals.

4. The touch display device as claimed in claim 1, wherein the fingerprint devices comprises a plurality of transistors.

5. The touch display device as claimed in claim 1, wherein the plurality of photo sensors are disposed under the plurality of pixel units.

6. The touch display device as claimed in claim 5, wherein the pixel units are disposed in a patterned metal layer further comprising a plurality of second collimating openings positioned between the pixels units and corresponding to the plurality of photo sensors respectively to collimate light from different locations to the plurality of photo sensors.

7. The touch display device as claimed in claim 6, wherein the display structure further comprises a display substrate, and the plurality of photo sensors are disposed underneath the display substrate.

8. The touch display device as claimed in claim 1, wherein the touch sensing layer comprises a single layer of self-capacitance electrodes.

9. The touch display device as claimed in claim 8, wherein the self-capacitance electrodes are divided into a plurality of touch sensing pads isolated from one another.

10. The touch display device as claimed in claim 1, wherein the touch sensing layer comprises dual-layers of self-capacitance electrodes.

11. The touch display device as claimed in claim 10, further comprising:
  a touch trace layer;
  an insulating layer disposed between the touch sensing layer and the touch trace layer; and
  a plurality of conductive vias connected between the touch sensing layer and the touch trace layer.

12. The touch display device as claimed in claim 1, wherein the touch sensing layer comprises dual-layers of mutual capacitance electrodes.

13. The touch display device as claimed in claim 1, wherein the touch sensing layer comprises a first set of touch electrodes configured to operate as drive lines and a second set of touch electrodes configured to operate as sense lines.

14. The touch display device as claimed in claim 13, further comprising:
  a bridge layer bridging over adjacent two of the first set of touch electrodes from a top view;
  an isolation layer disposed between the touch sensing layer and the bridge layer; and
  a plurality of conductive vias connected between the bridge layer and the adjacent two of the first set of touch electrodes.

15. The touch display device as claimed in claim 1, wherein the touch display panel is a touch organic light emitting diode (OLED) display panel.

16. The touch display device as claimed in claim 15, further comprising a cathode layer disposed over the plurality of pixel units.

17. The touch display device as claimed in claim 1, wherein the touch sensing layer further comprises a plurality of pixel openings corresponding to the plurality of pixel units respectively.

18. The touch display device as claimed in claim 1, wherein a plurality of pixel openings with side walls extending through the touch sensing layer, the plurality of pixel openings are aligned with the plurality of pixel units respectively.

* * * * *